(12) United States Patent
Ando et al.

(10) Patent No.: US 8,498,437 B2
(45) Date of Patent: Jul. 30, 2013

(54) PANEL OPENING AND CLOSING STRUCTURE OF ELECTRIC OPERATION APPARATUS

(75) Inventors: Takeshi Ando, Hamamatsu (JP); Ryuichi Izumi, Hamamatsu (JP)

(73) Assignee: Yamaha Corporation (JP)

( * ) Notice: Subject to any disclaimer, the term of this patent is extended or adjusted under 35 U.S.C. 154(b) by 951 days.

(21) Appl. No.: 12/603,839

(22) Filed: Oct. 22, 2009

(65) Prior Publication Data

US 2010/0097748 A1    Apr. 22, 2010

(30) Foreign Application Priority Data

Oct. 22, 2008   (JP) .................................. 2008-271917

(51) Int. Cl.
*H04R 1/20* (2006.01)
*A47B 81/06* (2006.01)

(52) U.S. Cl.
USPC .......................................... 381/345; 181/198

(58) Field of Classification Search
USPC ................... 381/87, 301, 305, 333, 334, 345, 381/386, 388, 395; 84/633, 644, 718; 181/198; 361/679.01, 679.02
See application file for complete search history.

(56) References Cited

U.S. PATENT DOCUMENTS

| 5,355,357 | A | * | 10/1994 | Yamamori et al. | ........ 361/679.01 |
| 5,402,501 | A | * | 3/1995 | Silfvajt et al. | .................. 381/119 |
| 6,057,829 | A | * | 5/2000 | Silfvast | .......................... 345/156 |
| 2008/0257639 | A1 | * | 10/2008 | Yamaguchi et al. | .......... 181/198 |

FOREIGN PATENT DOCUMENTS

JP    2005-099444 A    4/2005

* cited by examiner

*Primary Examiner* — Brian Ensey
(74) *Attorney, Agent, or Firm* — Rossi, Kimms & McDowell LLP

(57) ABSTRACT

An electric operation apparatus capable of opening interiors of front and rear portions of an apparatus main body frontward and rearward to make it easy to carry out assembly and maintenance inside the main body. Front and rear pivot shafts are provided on inner side surfaces of side plates of the main body so as to extend in the left-right direction of the main body. Front and rear panels are openable and closable relative to the main body by being pivoted about the pivot shafts, with their engagement recesses in engagement with the pivot shafts. The front and rear panels cover the main body when they are in closed states, and open the interior of the main body when they are in open states. The front panel is opened by being pivoted rearward, whereas the rear panel is opened by being pivoted forward.

7 Claims, 3 Drawing Sheets

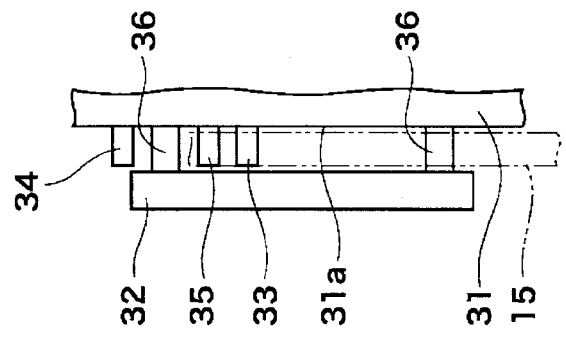
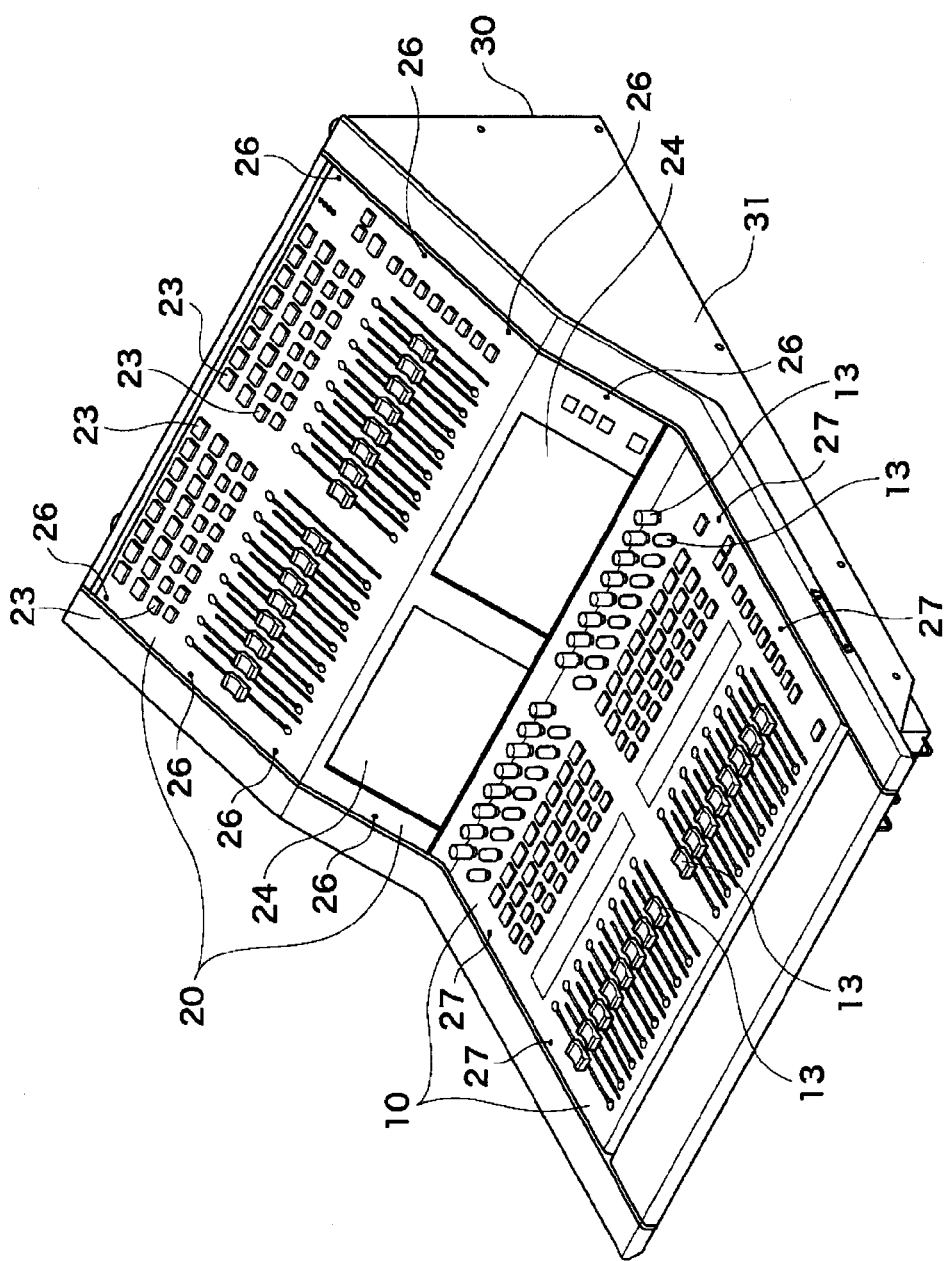

PANEL OPENING AND CLOSING STRUCTURE OF ELECTRIC OPERATION APPARATUS

BACKGROUND OF THE INVENTION

1. Field of the Invention

The present invention relates to a panel opening and closing structure of an electric operation apparatus in which an apparatus main body is configured to be covered from above by control panels mounted with operating elements.

2. Description of the Related Art

Conventionally, there have been known an electric operation apparatus (e.g., mixer apparatus) having a main body thereof covered from above by a control panel mounted with a number of operating elements. The control panel is generally formed by a single panel that covers the entirety of an upper open surface of the apparatus main body, and is openable by being pivoted upward and rearward about a front end of the electric operation apparatus. At fabrication or maintenance of the electric operation apparatus, an open state of the control panel is maintained by, e.g., support rods, thereby permitting access to the interior of the main body for internal work.

Such workability has also been taken into account in the design of electronic keyboard instrument as disclosed in Japanese Laid-open Patent Publication No. 2005-99444. The keyboard instrument disclosed therein has a keyboard unit configured to be opened and closed about a rear end of an instrument main body such that a front end portion of the keyboard unit can be opened upward for easy maintenance of, e.g., a main circuit inside the instrument.

However, since the interior of an electric operation apparatus having a control panel formed by a single panel can be opened only toward the front or rear side, it is difficult to access from another side to the interior of the apparatus for internal work (e.g., assembly and maintenance).

In particular, in a large-sized electric operation apparatus having a control panel of single panel structure, the control panel per se is large in size and heavy in weight, thus making it laborious to open and close the control panel.

In addition, the apparatus becomes unstable in posture, if the control panel is opened by being pivoted about a pivot shaft at the front or rear end of the apparatus main body such that the position of the center of gravity of the panel is near or beyond the front or rear end of the main body in the front-rear direction. Accordingly, the control panel cannot be pivoted to be opened at a large angle and hence the open area of the apparatus becomes small, resulting in low workability. In addition, since a large load is concentrated to some part of the apparatus main body, the rigidity of the main body must be increased, resulting in the increase of apparatus weight and reduction of workability.

SUMMARY OF THE INVENTION

The present invention provides a panel opening and closing structure of an electric operation apparatus, which is capable of opening the interiors of front and rear portions of an apparatus main body frontward and rearward, thereby making it easy to implement the assembly of constituent elements of the apparatus and maintenance inside the apparatus main body.

According to the present invention, there is provided a panel opening and closing structure of an electric operation apparatus having an apparatus main body and a panel for covering the apparatus main body from above, which comprises a plurality of pivot shafts provided on the apparatus main body so as to respectively correspond to a plurality of control panels constituting the panel and each mounted with operating elements, the pivot shafts being provided at different positions in a front-rear direction of the apparatus main body and extending in a left-right direction of the apparatus main body, and engagement portions provided on the plurality of control panels for engagement with respective ones of the pivot shafts, wherein each of the control panels is configured to be openable and closable about a corresponding one of the pivot shafts, with the engagement portion thereof in engagement with the pivot shaft, the plurality of control panels are configured to cover different portions in the front-rear direction of the apparatus main body when the control panels are each in a closed state and configured to open an interior of the apparatus main body when the control panels are each in an open state, a frontmost control panel of the plurality of control panels has an engagement portion thereof provided at a rear end portion of the frontmost control panel which is in the closed state, the frontmost control panel being configured to be opened by being rearwardly pivoted about the pivot shaft corresponding thereto, and a rearmost control panel of the plurality of control panels has an engagement portion thereof provided at a front end portion of the rearmost control panel which is in the closed state, the rearmost control panel being configured to be opened by being forwardly pivoted about the pivot shaft corresponding thereto.

With this invention, the interiors of front and rear portions of the apparatus main body can be opened frontward and rearward, respectively, thus making it easy to carry out assembly of constituent elements of the apparatus and maintenance inside the apparatus.

In this invention, the apparatus main body can have an open-state maintaining device configured to be in engagement with each of the control panels which is in the open state, to thereby maintain the open state of the control panel.

In this case, it is possible to carry out work inside the apparatus main body without the removing the control panels or holding them by hand.

The rearmost control panel can have a rear end portion having an upper surface thereof located upward of an upper surface of the rear end portion of the frontmost control panel.

The plurality of control panels can only include the frontmost control panel and the rearmost control panel, and the apparatus main body can have a rearward pivot restricting device configured for engagement with the frontmost control panel to restrict the frontmost control panel to a rearward pivot limit position thereof and a forward pivot restricting device configured for engagement with the rearmost control panel to restrict the rearmost control panel to a forward pivot limit position thereof, thereby preventing interference between the frontmost control panel in the rearward pivot limit position and the rearmost control panel in the forward pivot limit position.

In this case, it is possible to simultaneously open both the front and rear control panels so as not to interfere with each other, whereby the workability can be improved.

The plurality of control panels can only include the frontmost control panel and the rearmost control panel, and both the pivot shaft corresponding to the frontmost control panel and the pivot shaft corresponding to the rearmost control panel can be disposed at intermediate positions in the front-rear direction of the apparatus main body.

In this case, positions of the centers of gravity of the front and rear control panels in the open states become close to intermediate positions in the front-rear direction of the apparatus main body. As a result, the apparatus becomes stable in posture, even if the panels are each pivoted to be opened at a large angle. It is therefore possible to open substantially the entire interior of the apparatus main body, resulting in improved workability.

Further features of the present invention will become apparent from the following description of an exemplary embodiment with reference to the attached drawings.

BRIEF DESCRIPTION OF THE DRAWINGS

FIG. 1A is a perspective view showing a mixer apparatus having a panel opening and closing structure according to one embodiment of this invention;

FIG. 1B is a fragmentary plan view showing a right side portion of a front half of the mixer apparatus, with a front panel removed from the mixer apparatus;

DETAILED DESCRIPTION OF THE PREFERRED EMBODIMENT

The present invention will now be described in detail below with reference to the drawings showing a preferred embodiment thereof.

FIG. 1A shows in perspective view an electric operation apparatus having a panel opening and closing structure according to one embodiment of this invention. The electric operation apparatus is configured as a mixer apparatus 100 and has a main body 30 whose front and rear halves have upper open surfaces thereof respectively covered by front and rear control panels 10, 20. In the following, the terms "left-right direction" and "front-rear direction" refer to directions as viewed from an operator sitting in front of the front panel 10 of the mixer apparatus 100.

FIG. 1B shows in fragmentary plan view a right side portion of the front half of the mixer apparatus 100, with the front panel 10 removed from the mixer apparatus 100. In FIG. 1B, there is shown the right side portion as seen from a direction shown by arrow F1 in FIG. 2B. As described later, the front and rear panels 10, 20 can be opened and closed even after being assembled to the apparatus main body 30 for, e.g., maintenance inside the main body 30.

Figure 2A:
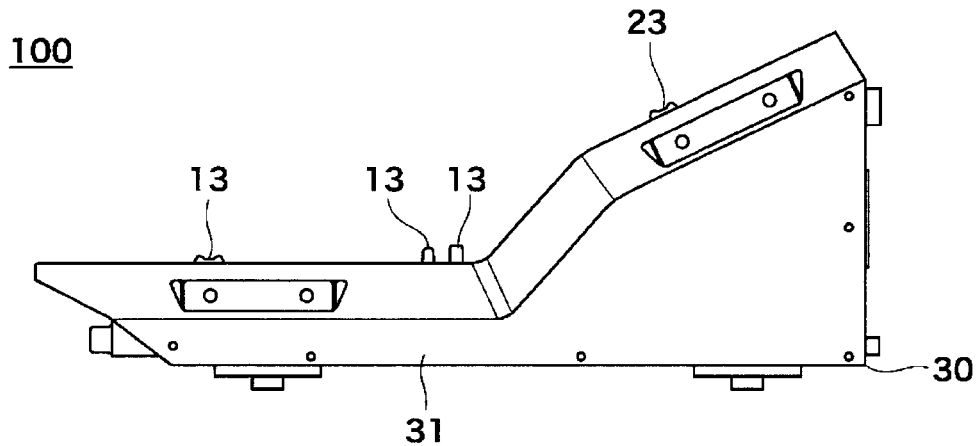
FIGS. 2A and 2B are right side views showing the mixer apparatus in a state that front and rear panels are closed and in state that the front and rear panels are open.
Figure 2B:
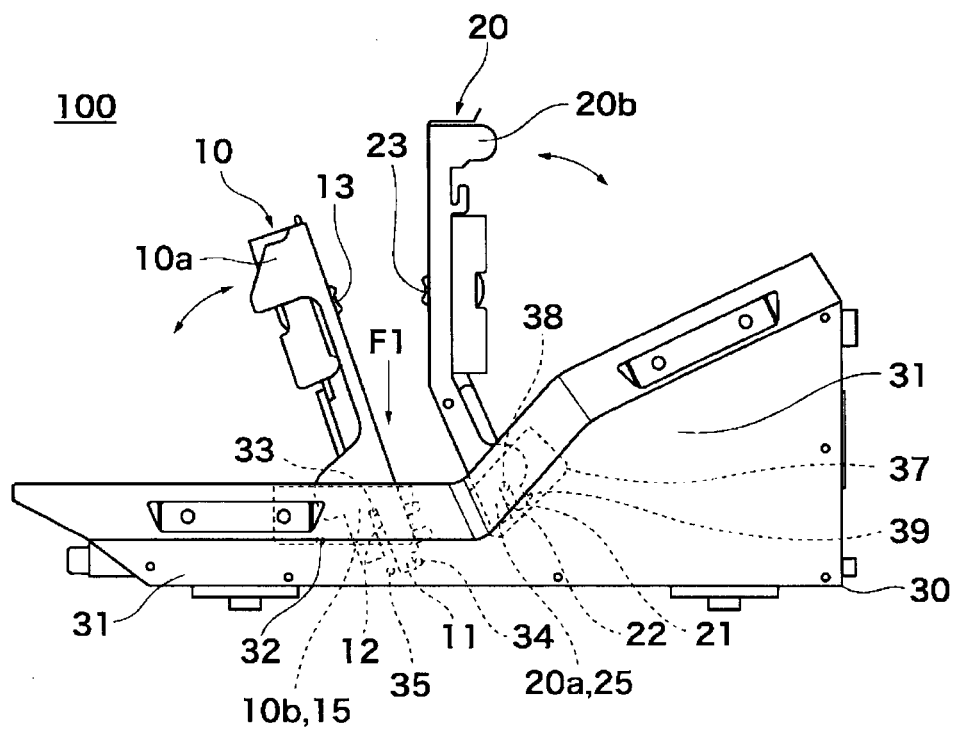

FIGS. 2A and 2B show in right side view the mixer apparatus 100 in a state that front and rear panels 10, 20 are closed and in a state that the panels 10, 20 are open.

As shown in FIGS. 1A, 2A and 2B, a number of operating elements 13 are mounted on the front panel 10, and a number of operating elements 23 and display units 24 (each implemented by an LCD) are mounted on the rear panel 20. The operating elements 13, 23 include slide type fader operating elements, and also include rotary type, depression type and/or other type operating elements. LEDs are mounted on the panels 10, 20, and one or more display units can be disposed on the front panel 10. It is enough, however, that at least a plurality of operating elements are disposed on each of the panels 10, 20.

Open and close structures for pivotably supporting the panels 10, 20 and maintaining open states of these panels are provided on the left and right sides of the apparatus main body 30. In the following, the open and close structure on the right side of the main body 30 is mainly described.

As shown in FIGS. 1B and 2B, a guide plate 32 (corresponding to the front panel 10) is disposed on the inside of a front half of a right-hand side plate 31 of the main body 30 so as to extend parallel to the side plate 31. The guide plate 32 is fastened by screws to two bosses fixed (e.g., welded) to an inner side surface 31a of the side plate 31, whereby the guide plate 32 is fixed to the side plate 31. A front pivot shaft 33 and stopper pins 34, 35 are also provided on (e.g., welded to) the inner side surface 31a of the side plate 31. It is enough that the front pivot shaft 33 and the stopper pins 34, 35 are rigidly fixed to the side plate 31. The pivot shaft 33 and the stopper pins 34, 35 may each be fixed at a tip end to the guide plate 32.

A guide plate 37 (corresponding to the rear panel 20) similar to the guide plate 32 is disposed on the inside of a rear half of the right-hand side plate 31 of the apparatus main body 30. Further, a rear pivot shaft 38 and a stopper pin 39, similar to the front pivot shaft 33 and the stopper pin 34, are provided on the inner side surface 31a of the side plate 31.

Although not illustrated, constituent elements, which correspond to the guide plates 32, 37, front and rear pivot shafts 33, 38, and stopper pins 34, 35, 39 on the right side of the main body 30, are provided also on the left side of the main body 30. The elements on the left side and the elements on the right side are disposed symmetrically with one another. It should be noted that the constituent elements can be disposed only on the left or right side of the main body 30. The front and rear pivot shafts 33, 38 extend in the left-right direction of the main body 30 and are disposed at intermediate positions, which are close to each other, in the front-rear direction of the main body 30.

The designation "front and rear end portions" of the panels 10, 20 represents panel portions positioned on the front and rear sides of the main body 30 when the panels 10, 20 are in the close states in which they cover the main body 30. When the panels 10, 20 are in the open states shown in FIG. 2B, the front and rear end portions 10a, 10b of the front panel 10 are positioned on upper and lower sides, whereas the front and rear end portions 20a, 20b of the rear panel 20 are positioned on lower and upper sides, respectively.

The front panel 10 is provided at left and right sides of the rear end portion 10b with engagement pieces 15 extending parallel to the side plates 31 and the guide plates 32 of the apparatus main body 30 (see, FIGS. 1B and 2B). Each of the engagement pieces 15 has a thickness slightly less than a corresponding one of gaps between the side plates 31 and the guide plates 32, so that the engagement pieces 15 can be slid within the gaps when the front panel 10 is opened and closed.

As shown in FIG. 2B, the engagement pieces 15 each have a tip end thereof formed into a bifurcated extension having an engagement recess 12. The bifurcated extension includes an extension 11, which is positioned on the rear side when the front panel 10 is open and positioned on the upper side when the front panel 10 is closed.

The rear panel 20 is provided at left and right sides of the front end portion 20a with engagement pieces 25 configured for engagement with gaps between the side plates 31 and the guide plates 37, as with the engagement pieces 15 (see, FIG. 2B). Each engagement piece 25 has its tip end formed into a bifurcated extension having an engagement recess 22. The bifurcated extension includes an extension 21 positioned on the rear side when the rear panel 20 is open and positioned on the lower side when the rear panel 20 is closed.

As shown in FIGS. 2A and 2B, the rear panel 20 has an upper surface thereof obliquely extending upward rearward. In other words, the upper surface of the rear end portion 20b of the rear panel 20 is located upward of an upper surface of the rear end portion 10b of the front panel 10 irrespective of whether the front and rear panels 10, 20 are in the open states or in the closed states.

To assemble the front panel 10 to the apparatus main body 30, the left-hand and right-hand engagement pieces 15 of the panel 10 are inserted into the gaps between the side plates 31 and the guide plates 32, while maintaining the front panel 10 vertically with the front end portion 10a positioned upward. Then, the engagement pieces 15 are brought in engagement at the engagement recesses 12 with the front pivot shafts 33. The side plates 31 and the guide plates 32 have a guide function to restrict the position of the front panel 10 in the left-right direction relative to the apparatus main body 30.

Since the engagement recesses 12 of the front panel 10 are simply fitted onto the front pivot shafts 33 for engagement therewith, the engagement therebetween can be released. In a state that the engagement recesses 12 are in engagement with the front pivot shafts 33, the front end portion 10a of the front panel 10 is pivotable about the front pivot shafts 33 in the vertical and front-rear directions (clockwise and counter-clockwise directions in FIG. 2B).

In a closed state of the front panel 10 where the engagement recesses 12 are in engagement with the front pivot shafts 33, the front panel 10 is fastened to the apparatus main body 30 by fasteners 27 (e.g., screws), whereby the assembly of the front panel 10 to the main body 30 is completed.

To open the front panel 10, the fasteners 27 are detached and then the front end portion 10a of the front panel 10 is pivoted upwardly and rearwardly. If the front panel 10 is pivoted further, the extensions 11 will collide with the stopper pins 34 (see, FIG. 2B). To prevent the collision, the front panel 10 is slightly moved upward to slightly separate the engagement recesses 12 from the front pivot shafts 33, and then the front panel 10 is further pivoted. When the front panel 10 is pivoted town angle where the extensions 11 are each positioned between the stopper pins 34, 35, the front panel 10 is moved downward so that the engagement recesses 12 are securely engaged with the front pivot shafts 33.

In that state, the front panel 10 is slightly inclined forward and the position of the center of gravity of the panel is located frontward of the front pivot shafts 33. Thus, the front panel 10 attempts to pivot forward about the shafts 33, and becomes stable when the extensions 11 are in contact with the stopper pins 34. In other words, the stopper pins 34 function to prevent the front panel 10 from being closed, whereby the open state of the panel 10 is maintained.

If an external force acts on the front panel 10 in the open state in a direction to cause the panel 10 to pivot rearward, the extensions 11 are brought in contact with the stopper pins 35 to prevent a further rearward pivotal motion of the panel 10. In other words, the stopper pins 35 function to restrict the front panel 10 to its rearward pivot limit position (i.e., function to define the rearward pivot limit position of the front panel 10).

The open and close structure of the rear panel 20 is basically the same as that of the front panel 10 except that the opening and closing directions of the rear panel 20 are opposite from those of the front panel 10.

To assemble the rear panel 20 to the apparatus main body 30, the left-hand and right-hand engagement pieces 25 of the panel 20 are inserted into gaps between the side plates 31 and the guide plates 37, while maintaining the rear panel 20 vertically with the rear end portion 20a positioned upward. Then, the engagement pieces 25 are brought in engagement at their engagement recesses 22 with the rear pivot shafts 38. The side plates 31 and the guide plates 37 have a guide function to restrict the position of the rear panel 20 in the left-right direction relative to the apparatus main body 30.

In a state that the engagement recesses 22 of the rear panel 20 are in engagement with the rear pivot shafts 38, the rear end portion 20b is pivotable about the rear pivot shafts 38 in the vertical and front-rear directions (clockwise and counter-clockwise directions in FIG. 2B).

In a closed state of the rear panel 20 where the engagement recesses 22 are in engagement with the rear pivot shafts 38, the rear panel 20 is fastened to the apparatus main body 30 by fasteners 26 (e.g., screws), whereby the rear panel 20 is assembled and fixed to the main body 30.

To open the rear panel 20, the fasteners 26 are detached and then the rear end portion 20b of the rear panel 20 is pivoted upwardly and forwardly. As a result, the extensions 21 are brought in contact with the stopper pins 39, whereby the rear panel 20 is restricted at its forward pivot end position.

In that state, the position of the center of gravity of the rear panel 20 is located forward of the rear pivot shafts 38. Thus, the rear panel 20 attempts to further pivot forward about the rear pivot shafts 38, but is kept stable in the open state where the extensions 21 are in contact with the stopper pins 39. In other words, the stopper pins 39 function to maintain the open state of the rear panel 20.

As shown in FIG. 2B, the panels 10, 20 never interfere with each other when the panels are maintained in the open states by the stopper pins 34, 39. As a result, the upper open surface of the apparatus main body 30 is substantially fully opened to thereby open the interior of the main body 30, making it easy to implement, e.g., maintenance.

In particular, since the front and rear pivot shafts 33, 38 are disposed at intermediate positions, which are close to each other, in the front-rear direction of the apparatus main body 30, the centers of gravity of the front and rear panels 10, 20 in the open states are located close to the intermediate positions in the front-rear direction of the main body 30. As a result, even if the panels 10, 20 are pivoted to be opened at large angles, the main body 30 is kept stable in posture without the front or rear side thereof from being raised from an installation surface. Accordingly, the upper open surface of the main body 30 can largely be opened, whereby the workability is improved. Since the entire panel is divided into two, i.e., the front and rear panels 10, 20, each of the panels is light weighted, resulting in a reduction in load concentration to some part of the apparatus main body 30 when the panels 10, 20 are opened and closed and are in the open states, whereby the need of undesirably increasing the rigidity of the main body 30 can be eliminated. Thus, light weight and improved workability, e.g., at assemblage can be achieved.

According to this embodiment, since the front panel 10 is opened rearward and the rear panel 20 is opened forward, the interior of the front side of the apparatus main body 30 can be accessed from front and the interior of the rear side thereof can be accessed from rear, whereby assembly work and maintenance work inside the main body 30 can be carried out with ease.

Since the stopper pins 34, 39 function to maintain the open states of the panels 10, 20, internal work inside the main body 30 can be made without removing the panels 10, 20 or holding the panels by hand.

When the front panel 10 is restricted to the rearward pivot limit position by the stopper pins 35 and the rear panel 20 is restricted to the forward pivot limit position by the stopper pins 39, the front and rear panels 10, 20 are prevented from interfering with each other and therefore can be opened simultaneously, whereby workability can be improved.

Since the front and rear pivot shafts 33, 38 are disposed at intermediate positions, which are close to each other, in the front-rear direction of the apparatus main body 30, the pivot angles of the panels 10, 20 in the open states can be made large, whereby the entirety of the upper open surface of the apparatus main body 30 can largely be opened, resulting in improved workability.

In the open and close structures of the panels 10, 20 shown in FIGS. 1A, 1B, 2A and 2B, the stopper pins 34, 39 are used as an open-state maintaining device for maintaining the open states of the front and rear panels 10, 20, the stopper pins 35 are used as a rearward pivot restricting device for restricting the front panel 10 to the rearward pivot limit position, and the stopper pins 39 are used as a forward pivot restricting device for restricting the rear panel 20 to the forward pivot end position. However, these devices are not limited to the stopper pins 34, 35, 39. In a case, for example, that the inclinations or the positions of the centers of gravity of the panels 10, 20 in open states are different from those in the embodiment, the devices have different arrangements or constructions. In the following, modifications of the panel opening and closing structure are described.

Figure 3A:
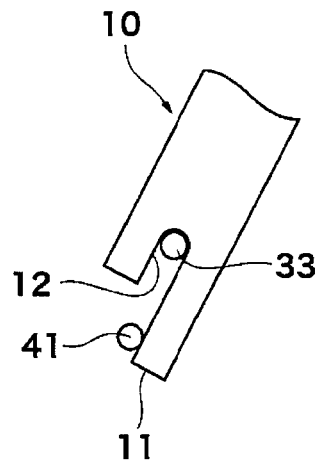
FIGS. 3A and 3B are schematic views showing modifications of the open and close structure of the front panel.
Figure 3B:
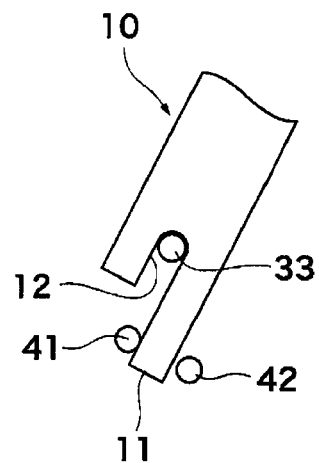

FIG. 3A and FIG. 3B schematically show modifications of the opening and closing structure of the front panel 10. In the example shown in FIG. 2B, the position of the center of gravity of the front panel 10 in open state is located forward of the front pivot shaft 33. On the other hand, in the modifications shown in FIGS. 3A and 3B, the position of the center of gravity of the front panel is located rearward of the front pivot shaft 33. Thus, the front panel 10 in open state attempts to pivot in the clockwise direction in FIG. 3A. In the examples shown in FIGS. 3A and 3B, as an open-state maintaining device, stopper pins 41 are disposed forward of the extensions 11, instead of the stopper pins 34. The stopper pins 41 also function as a rearward pivot restricting device for restricting the front panel 10 to a rearward pivot limit position.

In the example shown in FIG. 3B, stopper pins (one of which is denoted by reference numeral 42) for restricting a movement of the front panel 10 in the closing direction, due to an external force, are provided.

Figure 3C:
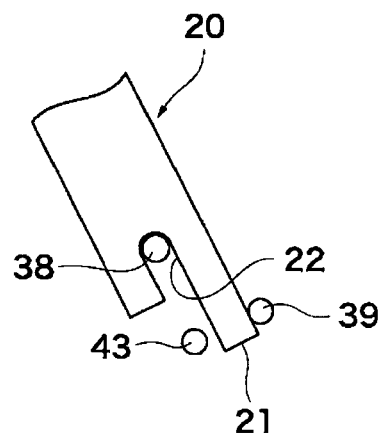
FIGS. 3C and 3D are schematic views showing modifications of the open and close structure of the rear panel.
Figure 3D:
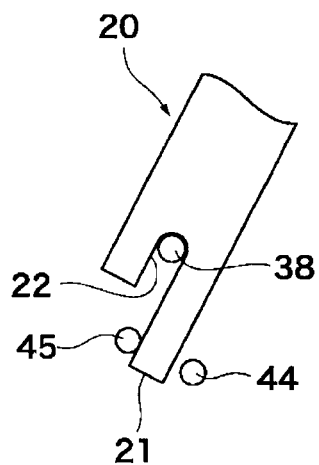

FIGS. 3C and 3D schematically show modifications of the opening and closing structure of the rear panel 20. In the modification shown in FIG. 3C, stopper pins (one of which is denoted at 43) for restricting a pivotal motion of the rear panel 20 in open state in the closing direction, due to an external force, are added to the example shown in FIG. 2B. The stopper pins 39 function similarly to those shown in FIG. 2B.

In the modification shown in FIG. 3D, unlike the example shown in FIG. 2B, the position of the center of gravity of the rear panel 20 in open state is located rearward of the rear pivot shaft 38. Thus, the rear panel 20 in open state attempts to pivot in the clockwise direction in FIG. 3D. Accordingly, in the example shown in FIG. 3D, stopper pins 45 as an open-state maintaining device are disposed forward of the extensions 21, instead of the stopper pins 39.

In the modification shown in FIG. 3D, stopper pins (one of which is shown at 44) as a forward pivot restricting device for restricting the rear panel 20 to a forward pivot limit position are disposed rearward of the extensions 21.

It should be noted that the open-state maintaining device and the pivot restricting devices are not limited to stopper pins, but can each be constituted by, e.g., support rods or other elements configured for engagement with the panel 10 or 20 to achieve the intended function.

Figure 3E:
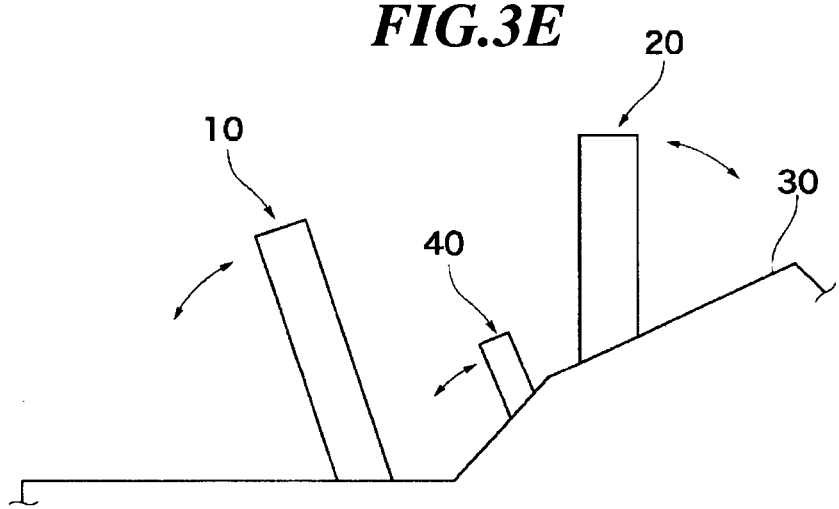
FIG. 3E is a schematic side view showing a mixer apparatus having three panels.

The above described embodiment includes the two control panels, i.e., the front and rear panels. Alternatively, three or more control panels can be provided as shown in a modification of FIG. 3E. Insofar as the construction for opening the interiors of front and rear portions of the apparatus main body 30 frontward and rearward is concerned, it is enough that a plurality of control panels include the frontmost control panel (panel 10 in FIG. 3E) configured to be opened by being pivoted rearward (clockwise) and the rearmost control panel (panel 20 in FIG. 3E) configured to be opened by being pivoted forward (counterclockwise). An intermediate control panel (panel 40 in FIG. 3E) disposed between the frontmost and rearmost control panels is configured to be opened by being pivoted, e.g., rearward although the pivoting direction is not limitative.

It should be noted that in the embodiment and the modifications, the engagement recesses 12, 22 of the panels 10, 20 are separable from the pivot shafts 33, 38. Alternatively, it can be configured that the engagement recesses 12 of the panel 10 and/or the engagement recesses 22 of the panel 20 are always in engagement with the pivot shafts 33 and/or the pivot shafts 38 during the entire panel opening and closing process between open state and closed state. For example, it can be configured that the engagement recesses 22 of the rear panel 20 shown in FIG. 2B are always in engagement with the pivot shafts 38 since it is unnecessary to release the engagement therebetween when the rear panel 20 is opened and closed. In the example opening and closing structure of the front panel 10 shown in FIG. 3A, it can be configured that the engagement recesses 12 are always in engagement with the pivot shafts 33.

It should be noted that the mixer apparatus 100 is described as an example of the electric operation apparatus, but this is not limitative. This invention is also applicable to various electric operation apparatuses each having openable and closable control panels and configured for use in, e.g., ships, trains, aircrafts, electric power plants.

What is claimed is:

1. A panel opening and closing structure of an electric operation apparatus having an apparatus main body and a panel for covering the apparatus main body from above, comprising:

a plurality of pivot shafts provided on the apparatus main body so as to respectively correspond to a plurality of control panels constituting the panel and each mounted with operating elements, said pivot shafts being provided at different positions in a front-rear direction of the apparatus main body and extending in a left-right direction of the apparatus main body; and engagement portions provided on said plurality of control panels for engagement with respective ones of said pivot shafts, wherein each of said control panels is configured to be openable and closable about a corresponding one of said pivot shafts, with the engagement portion thereof in engagement with the pivot shaft, said plurality of control panels are configured to cover different portions in the front-rear direction of said apparatus main body when said control panels are each in a closed state and configured to open an interior of said apparatus main body when said control panels are each in an open state, a frontmost control panel of said plurality of control panels has an engagement portion thereof provided at a rear end portion of said frontmost control panel which is in the closed state, said frontmost control panel being configured to be opened by being rearwardly pivoted about the pivot shaft corresponding thereto, and a rearmost control panel of said plurality of control panels has an engagement portion thereof provided at a front end portion of said rearmost control panel which is in the closed state, said rearmost control panel being configured to be opened by being forwardly pivoted about the pivot shaft corresponding thereto.

2. The panel opening and closing structure according to claim 1, wherein said apparatus main body has an open-state maintaining device configured to be in engagement with each of said control panels which is in the open state, to thereby maintain the open state of the control panel.

3. The panel opening and closing structure according to claim 2, wherein the rearmost control panel has a rear end portion having an upper surface thereof located upward of an upper surface of the rear end portion of the frontmost control panel.

4. The panel opening and closing structure according to claim 1, wherein said plurality of control panels only include the frontmost control panel and the rearmost control panel, and the apparatus main body has a rearward pivot restricting device configured for engagement with the frontmost control panel to restrict the frontmost control panel to a rearward pivot limit position thereof and a forward pivot restricting device configured for engagement with the rearmost control panel to restrict the rearmost control panel to a forward pivot limit position thereof, thereby preventing interference between the frontmost control panel in the rearward pivot limit position and the rearmost control panel in the forward pivot limit position.

5. The panel opening and closing structure according to claim 1, wherein said plurality of control panels only include the frontmost control panel and the rearmost control panel, and both the pivot shaft corresponding to the frontmost control panel and the pivot shaft corresponding to the rearmost control panel are disposed at intermediate positions in the front-rear direction of the apparatus main body.

6. The panel opening and closing structure according to claim 1, wherein said apparatus main body has a right-hand and a left-side plate, and said plurality of pivot shafts are disposed on each of the right-hand and the left-side plate.

7. The panel opening and closing structure according to claim 1, wherein said engagement portions are respectively disposed on a left and a right side of each of said control panels.

* * * * *